(12) United States Patent
Gardner et al.

(10) Patent No.: US 6,214,123 B1
(45) Date of Patent: *Apr. 10, 2001

(54) CHEMICAL VAPOR DEPOSITION SYSTEMS AND METHODS FOR DEPOSITING FILMS ON SEMICONDUCTOR WAFERS

(75) Inventors: Mark I. Gardner, Cedar Creek; Mark C. Gilmer; Robert Paiz, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/137,902
(22) Filed: Aug. 20, 1998
(51) Int. Cl.$^7$ .................................................. C23C 16/00
(52) U.S. Cl. ......................... 118/730; 118/715; 118/718; 118/724; 118/728; 118/729; 118/730; 204/298; 422/100
(58) Field of Search ...................... 118/715, 50, 503, 118/718, 724, 728, 729, 730; 422/100; 204/298

(56) References Cited

U.S. PATENT DOCUMENTS

| | | | |
|---|---|---|---|
| 4,858,558 | * 8/1989 | Ohmura et al. | 118/725 |
| 5,611,858 | * 3/1997 | Zedja | 118/50 |
| 5,935,334 | * 8/1999 | Fong et al. | 118/723 ME |

* cited by examiner

*Primary Examiner*—Deborah Jones
*Assistant Examiner*—Lymarie Miranda

(57) ABSTRACT

The present disclosure relates to a chemical vapor deposition system including a chemical vapor deposition chamber, and a circlet wafer positioned within the chemical vapor deposition chamber. The circlet wafer is mounted on a rotatable member that at least partially extends through an opening of the wafer. A drive mechanism is used to rotate the rotatable member and the circlet wafer. The system also includes a gas injector for injecting reactive gases toward the circlet wafer. The present disclosure also relates to a chemical vapor deposition system including a chemical vapor deposition chamber, a wafer positioned within the chemical vapor deposition chamber, and a gas injector for injecting first and second reactive gases toward the wafer. The gas injector includes a mixing region for mixing the first and second reactive gases before the first and second reactive gases are discharged from the gas injector.

18 Claims, 4 Drawing Sheets

CHEMICAL VAPOR DEPOSITION SYSTEMS AND METHODS FOR DEPOSITING FILMS ON SEMICONDUCTOR WAFERS

FIELD OF THE INVENTION

The present invention relates generally to systems and methods for manufacturing semiconductor wafers. More particularly, the present invention relates to chemical vapor deposition systems and methods for depositing films on semiconductor wafers.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicabilities and numerous disciplines.

Semiconductor devices are commonly fabricated on silicon wafers by introducing sequentially stacked patterned layers, such as conductive, dielectric and capping layers, on the surfaces of the wafers. Chemical vapor deposition systems are commonly used to deposit films or layers on semiconductor wafers.

Chemical vapor deposition systems are typically equipped with the following components: (1) a chemical vapor deposition chamber; (2) deposition or reactive gas sources; (3) inlet lines for transferring gas from the gas sources into the deposition chamber; (4) a mechanism for heating the wafers on which the film is to be deposited; (5) an outlet line; and (6) a vacuum source or pump for evacuating the compression chamber through the outlet line.

Processing efficiency is an important aspect of chemical vapor deposition systems. To enhance process efficiency, it is desirable to maximize the size of wafers used in chemical vapor deposition systems.

SUMMARY OF THE INVENTION

One aspect of the present invention relates to a chemical vapor deposition system for use with a wafer, such as a circlet wafer, having a wafer opening. The chemical vapor deposition chamber includes a wafer mounting position at which the wafer can be mounted within the chamber. The system also includes a first gas injector for directing reactive gases toward the wafer mounting position, and a rotatable member constructed and arranged to extend at least partially through the wafer opening of the circlet wafer. A drive mechanism is used for rotating the rotatable member.

Another aspect of the present invention relates to a chemical vapor deposition method including the steps of providing a wafer including a wafer opening, and inserting a rotatable member through the wafer opening. The method also includes the steps of rotating the rotatable member and the wafer in unison, and depositing a layer on the rotating wafer.

A further aspect of the present invention relates to a chemical vapor deposition system including a chemical vapor deposition chamber. The system also includes a gas injector for discharging first and second reactive gases into the chamber. The gas injector includes a mixing region for mixing the first and second reactive gases before the first and second reactive gases are discharged from the gas injector into the chamber.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of the specification, illustrate several aspects of the invention and together with the description, serve to explain the principles of the invention. A brief description of the drawings is as follows.

DETAILED DESCRIPTION

Reference will now be made in detail to exemplary aspects of the present invention which are illustrated in the accompanying drawings. Wherever possible, the same reference numbers will be used throughout the drawings to refer to the same or like parts.

As previously described, semiconductor devices are commonly fabricated on silicon wafers by depositing, through chemical vapor deposition techniques, sequentially stacked layers or films on the surfaces of the wafers. As used throughout this specification and claims, the terms "semiconductor wafer" or "wafer" are intended to include wafer substrates as well as wafers having any number of stacked or patterned layers. Furthermore, these terms are intended to include all types of semiconductor/integrated circuit devices as well as precursor semiconductors/semiconductor devices.

Figure 1:
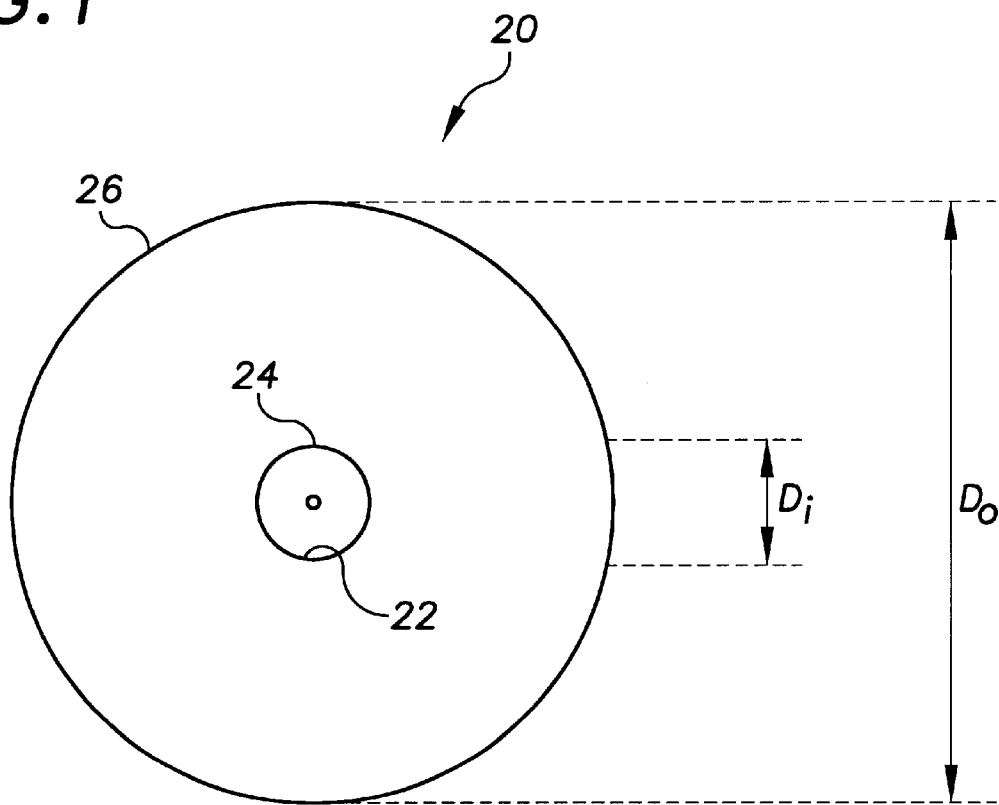
FIG. 1 is a plan view of a circlet wafer suitable for use in accordance with the principles of the present invention.
Figure 2:
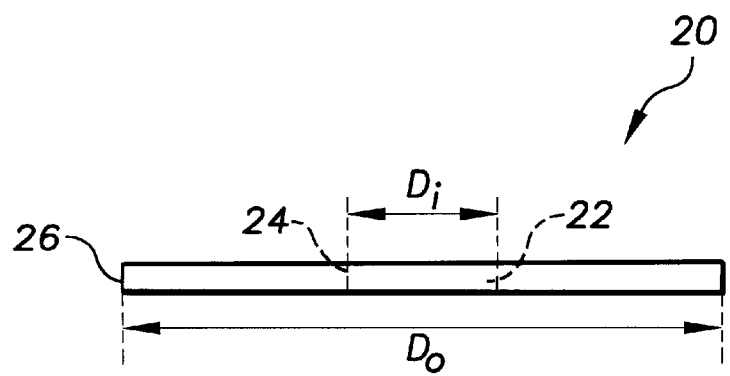
FIG. 2 is a side view of the circlet wafer to FIG. 1.

FIGS. 1 and 2 illustrate a circlet wafer 20 suitable for use with a chemical vapor deposition system in accordance with the principles of the present invention. The circlet wafer 20 includes a circular central opening 22 defined by a first boundary 24. A circumference of the circlet wafer 20 is defined by a second boundary 26 that is concentric with respect to the first boundary 24. By way of nonlimiting example, the circlet wafer 20 can have an inner diameter $D_i$ in the range of 5–10 mm, and an outer diameter $D_o$ greater than or equal to 450 mm.

Figure 3:
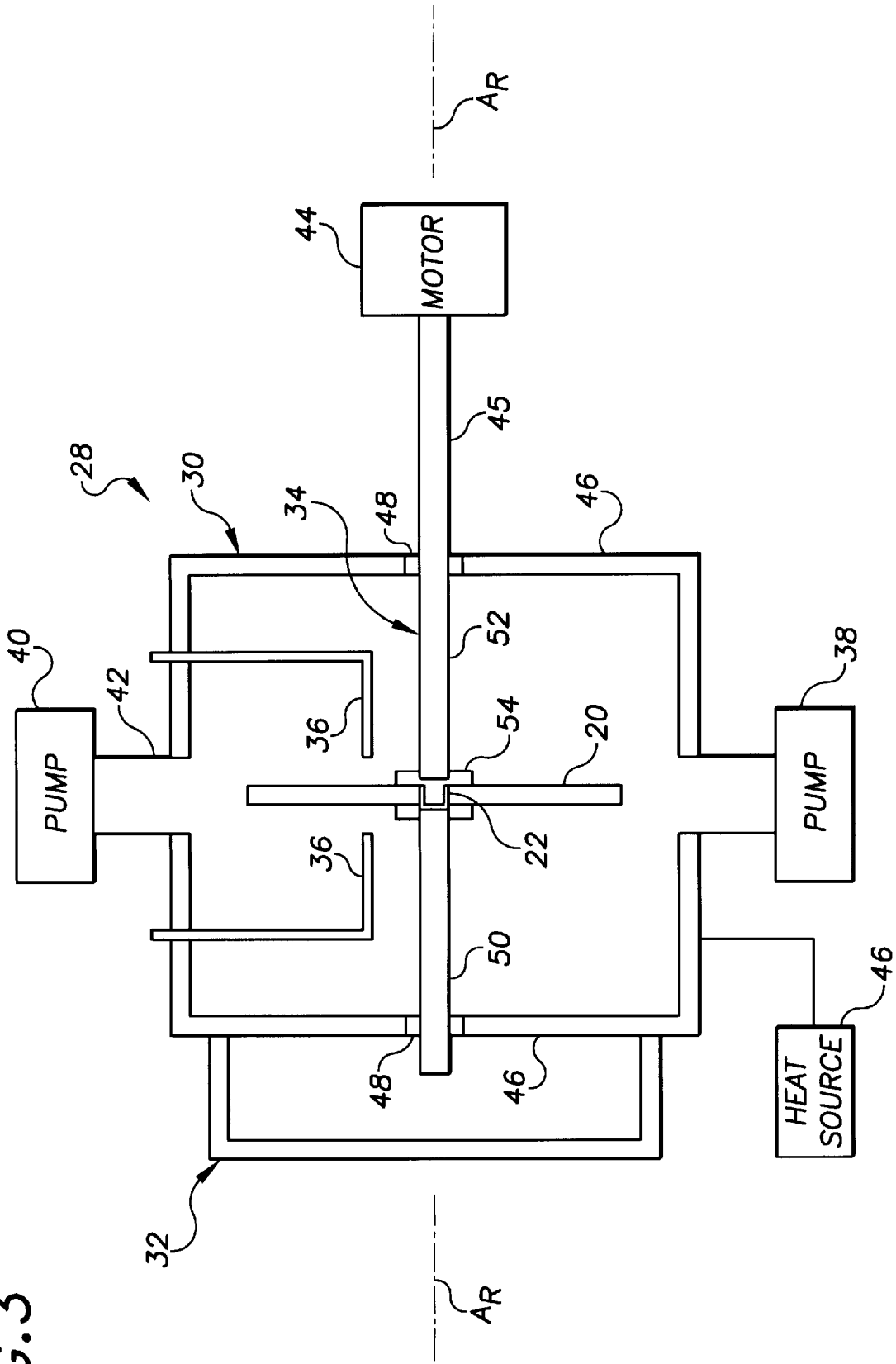
FIG. 3 is a schematic illustration of an embodiment of a chemical vapor deposition system constructed in accordance with the principles of the present invention.

FIG. 3 illustrates a chemical vapor deposition system 28 constructed in accordance with the principles of the present invention. Generally, the system 28 includes a chemical vapor deposition chamber 30 and a load lock 32 for supplying wafers to the chamber 30. A rotatable member 34 extends across the chemical vapor deposition chamber 30. Circlet wafer 20 is mounted on the rotatable member 34 at a wafer mounting position within the chemical vapor deposition chamber 30. Jet gas injectors 36 are used to direct reactive gases or deposition gases toward the circlet wafer 20. A small pump 38 and a large pump 40 are used to differentially pump the chemical vapor deposition chamber 30 down to base pressure (i.e., in the range of $10^{-1}$ to $10^{-3}$ torr) prior to processing. The large pump 40 also functions to exhaust waste byproduct from the deposition chamber 30 through outlet line 42. A drive mechanism 44, such as an electric motor or other type of conventional device for imparting rotation, is used to 10 rotate the rotatable member 34 about a longitudinal axis of rotation $A_r$. Finally, the system 28 also includes a thermal energy source 46, such as a lamp module or other type of heater, for heating the deposition chamber 30 during deposition processing.

The chemical vapor deposition system 28 can be used to deposit a variety of films on the wafer 20. Exemplary films include tetraethyl orthosilicate (TEOS) oxide, silane nitride, silane oxide, silicon nitride, silicon dioxide, and oxi nitride. To generate the previously identified films, a variety of reactant/deposition gases can be provided to the gas injectors 36. Exemplary gases include $O_3$, TEOS, $C_2F_8$, $O_2$, $NS_3$, $SiH_4$, $NH_3$, $N_2$, $N_2O$, $PH_3$, NFS, $OF_4$, monotomic nitrogen and dichlorostyrene.

The rotatable member 34 of the chemical vapor deposition system 28 includes an elongated drive shaft 45 that extends through opposite sidewalls 46 of the chemical vapor deposition chamber 30, and an insert or circlet hub 54 that is mounted within the central opening 22 of the circlet wafer 20. The circlet hub 54 can include two separate pieces that mount on opposite sides of the wafer 20 and thread together through the opening 22 such that the wafer 20 is clamped between the pieces. Seals 48 such as o-rings or ferro-fluidic seals provide fluid tight seals between the sidewalls 46 and the drive shaft 45. The drive shaft 45 includes first and second separate rods 50 and 52 that fit within or interlock with the circlet hub 54. Also, in certain embodiments of the present invention, the wafer 20 can be mechanically clamped between the ends of the two rods 50 and 52.

To facilitate mounting the circlet wafer 20 on the drive shaft 45, it is preferred to have two separate rods 50 and 52 as described above. For example, the circlet wafer 20 can be removed from the drive shaft 45 by axially sliding or retracting the first and second rods 50 and 52 away from one another such that the rods 50 and 52 disengage from the circlet hub 54. When the rods 50 and 52 disengage from the hub 54, the circlet wafer 20 can be removed from the chamber 30. A new circlet wafer can then be mounted on the drive shaft 45 by positioning the circlet wafer between the first and second rods 50 and 52, centering the circlet wafer on the axis of rotation $A_r$, and then axially sliding the first and second rods 50 and 52 together such that the rods interlock with the circlet hub of the new wafer. It will be appreciated that conventional automation technology can be used to axially slide the rods 50 and 52, and to load and unload the wafer 20 between the rods 50 and 52. For example, the rods 50 and 52 can be moved by conventional stepper or servo motors, and wafers can be positioned within the chamber by a conventional wafer transfer mechanism. It will also be appreciated that only one of the rods 50 and 52 needs to be moved relative to the other of the rods in order to provide clearance for inserting a wafer between the rods.

While a two piece drive shaft is described above, it will be appreciated that in certain embodiments of the present invention the drive shaft 45 can be a single piece. In such an embodiment, a circlet wafer can be mounted on the drive shaft by holding the circlet wafer in alignment with the shaft through the use of a wafer transfer mechanism, and then axially sliding the drive shaft through the circlet wafer. Similarly, the circlet wafer can be removed from the shaft by holding the wafer with a wafer transfer mechanism, and then sliding the shaft relative to the wafer such that the wafer passes over an end of the shaft.

Figure 4:
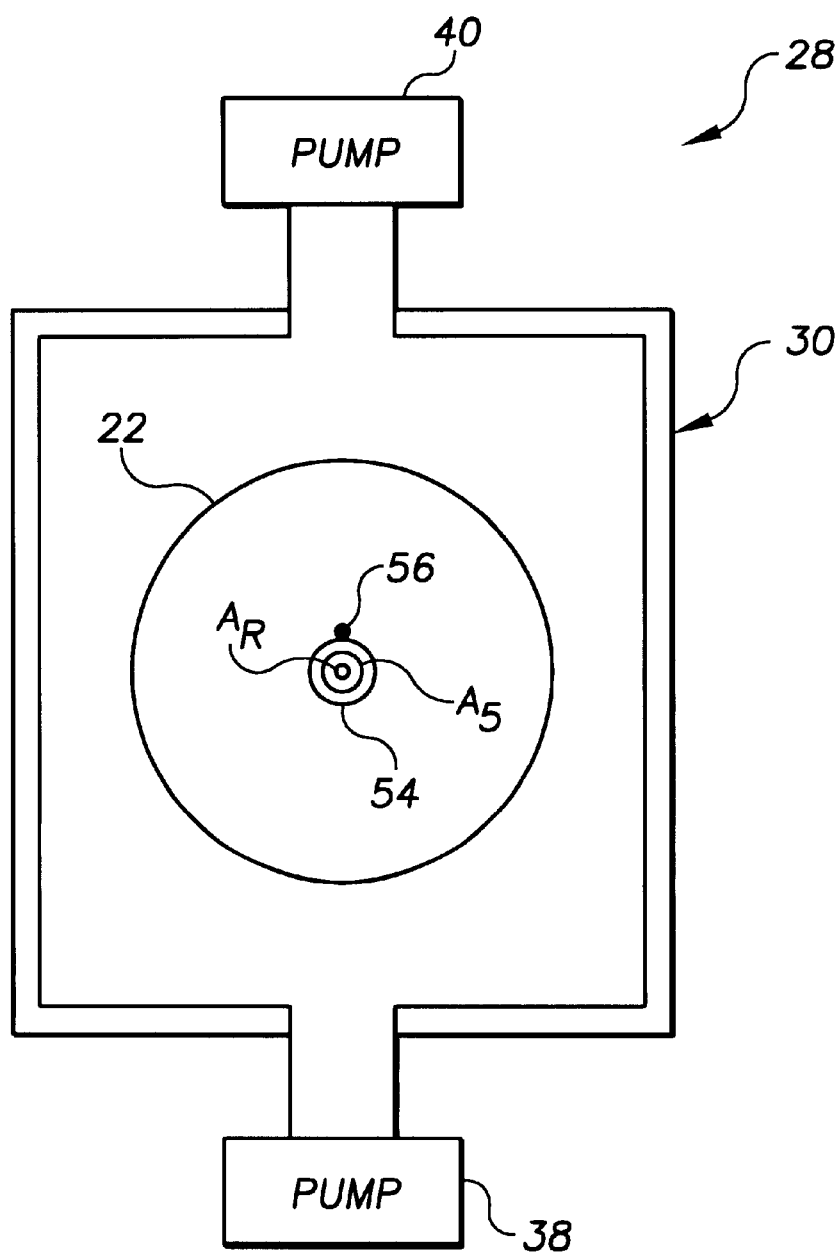
FIG. 4 is a schematic side view of the chemical vapor deposition system of FIG. 3.

Referring back to FIG. 3, the drive shaft 45 and the axis of rotation $A_r$ are generally horizontal, while the circlet wafer 20 is transversely aligned with respect to the axis of rotation $A_r$ and is aligned in a generally vertical plane. The circlet wafer 20 is centered about the axis of rotation $A_r$ and the gas injectors 36 are positioned on opposite sides of the circlet wafer 20. During deposition processing, the rotatable member 34 and the circlet wafer 20 are rotated in unison (i.e., at rotational speeds in the range of 10–300 rotations per minute), and reactant gases are directed from the gas injectors 36 toward the sides of the circlet wafer 20. The reactant gases are directed against the sides of the circlet wafer 20 and flow in an upward direction toward the outlet line 42. As shown in FIG. 4, the reactant gases are directed at a location 56 positioned directly above the longitudinal axis of rotation $A_r$ of the shaft 45. It will be appreciated that in alternative embodiments, the reactant gases can be directed toward regions of the circlet wafer 20 other than directly above the axis of rotation $A_r$.

The above-identified configuration allows relatively large wafers (i.e., exceeding 450 mm) to be efficiently processed. The configuration also allows both sides of a wafer to be simultaneously processed. Also, the configuration allows a wafer to be rotated at relatively high speeds with minimal risk of damaging the wafer. For example, because the rotatable member extends through the wafer, the wafer is inhibited from being centrifugally thrown from the rotatable member. By rotating the wafer, deposition uniformity and gas flow within the deposition chamber are also enhanced. Wafer rotation also provides uniform mixing of gases within the chamber.

Figure 5:
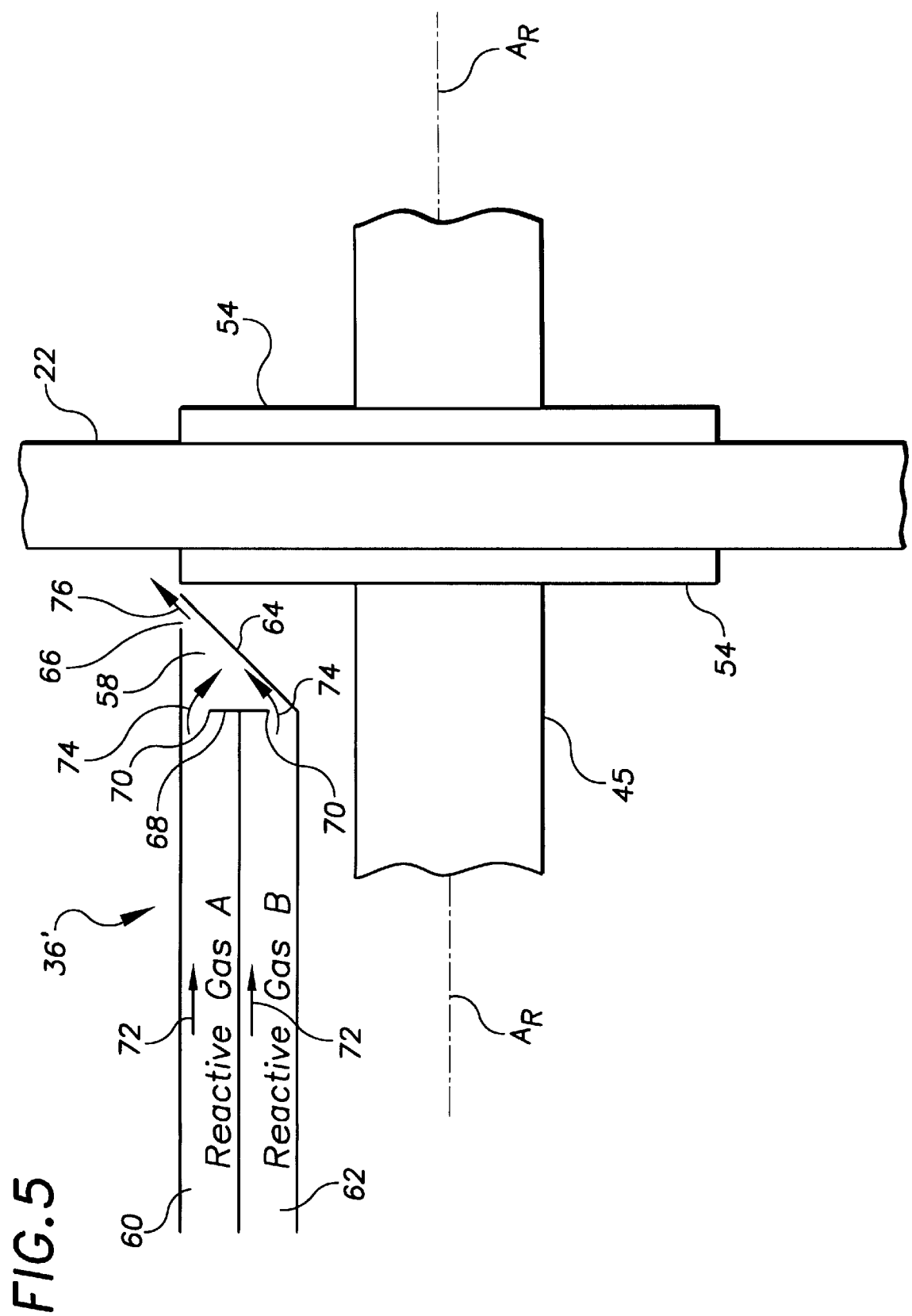
FIG. 5 is a schematic illustration of a cross jet injector constructed in accordance with the principles of the present invention.

FIG. 5 schematically shows an exemplary cross-jet injector 36' suitable for use with the chemical vapor deposition system 28. The injector 36' is adapted for discharging a reactant gas A and a reactant gas B toward the wafer 20 at speeds that can approach the speed of sound. The gas injector 36' includes a mixing chamber region 58 for mixing reactant gases A and B within the injector 36' before the reactant gases are discharged from the gas injector 36' toward the wafer 20.

The gas injector 36' also includes a first flow line 60 for directing the reactant gas A to the mixing region 58, and a second flow line 62 for directing the reactant gas B to the mixing region 58. As shown in FIG. 5, the first and second flow lines 60 and 62 are substantially parallel and are generally perpendicular with respect to the wafer 20.

The mixing region 58 of the injector 36' is at least partially defined by a mixing or crossflow wall 64 that extends obliquely across the first and second flow lines 60 and 62 and terminates at a discharge port 66. The injector 36' further includes a baffle 68 for enhancing turbulence or mixing within the mixing region 58. The baffle 68 is generally transversely aligned with respect to the first and second flow lines 60 and 62. The baffle 68 partially blocks the first and second flow line 60 and 62 and forces the reactive gases to flow around the ends 70 of the baffle 68 thereby generating turbulence.

In use, the reactive gases A and B respectively flow through the first and second flow lines 60 and 62 as shown by arrow 72. To enter the mixing region or chamber 58, the reactive gases A and B flow around the end 70 of the baffle 68 as shown by arrows 74. Within the mixing region 58, the gases from the first and second flow lines 60 and 62 cross one another thereby causing mixing of the reactive gases A and B. The mixed reactive gases A and B are discharged through discharge port and flow in an inclined direction illustrated by arrow 76 that is generally parallel to the cross flow wall 64.

By mixing the reactive gases A and B at the tip of the injector, unstable gases such as monatomic nitrogen are inhibited from breaking down prior to deposition. The cross-jet configuration also encourages uniform mixing of the gases.

A variety of known reactive gases can be used as reactive gases A and B. For example, reactive gas A could be gases such as monatomic nitrogen or SiH4. Also, reactive gas B could be gases such as Argon or $NH_3$. Of course, the above-identified reactive gases are strictly exemplary and other types of reactive gases can also be used.

For certain applications, the chemical vapor deposition system 28 can be used to create gate quality nitride dielectrics. For example, the chemical vapor deposition system 28 can be operated by first mounting the circlet wafer 20 on the rotatable member 34 such that the rotatable member 34 extends through the central opening 22 of the circlet wafer 20. The system is then pumped down to base pressure by the pumps 38 and 40 through the use of conventional differential pumping techniques. Subsequently, the chemical vapor deposition chamber 30 is typically heated to a temperature above 400° C. by the heat source 46 and the drive mechanism 44 is used to rotate the rotatable member 34 and the circlet wafer 20 in unison about the longitudinal axis of rotation $A_r$. By way of nonlimiting example, the circlet wafer 20 can be rotated in the range of 10–300 rotations per minute (RPM). Process gases are then injected into the chamber 30 using injectors such as the jet injector 36'. For example, process gases such as monotomic nitrogen and silane can be mixed within the injector 36' and injected toward the circlet wafer 20 thereby causing a gate quality nitride dielectric to be deposited on the surface of the wafer 20.

With regard to the foregoing description, it is to be understood that changes made be made in detail, especially in matters of the materials employed and the size, shape and arrangement of the parts without departing from the scope of the present invention. It is intended that the specification and depicted aspects of the invention be considered exemplary only with a true scope and spirit of the invention being indicated by the broad meaning of the following claims.

We claim:

1. A chemical vapor deposition system for use with a wafer defining a wafer opening, the system comprising:
   a chemical vapor deposition chamber having a wafer mounting position;
   a first gas injector for directing reactive gases toward the wafer when the wafer is mounted at the wafer mounting position;
   a rotatable member having a portion sized and shaped to extend through the wafer opening when the wafer is mounted at the wafer mounting position; and
   a drive mechanism for rotating the rotatable member.

2. The chemical vapor deposition system of claim 1, wherein the rotatable member includes a drive shaft having a longitudinal axis of rotation.

3. The chemical vapor deposition system of claim 2, wherein the longitudinal axis of rotation is generally horizontal.

4. The chemical vapor deposition system of claim 3, wherein the longitudinal axis of rotation transversely aligned with respect to the wafer when the wafer is mounted on the rotatable member.

5. The chemical vapor deposition system of claim 2, wherein the drive shaft includes two separate rods that interlock within a hub adapted to be press fit within the wafer opening of the wafer.

6. The chemical vapor deposition system of claim 2, further comprising a second gas injector, the first and second gas injectors being positioned on opposite sides of the wafer mounting position.

7. The chemical vapor deposition system of claim 1, wherein the wafer is mounted on the rotatable member and the wafer opening has a diameter in the range of 5–10 millimeters.

8. The chemical vapor deposition system of claim 7, wherein the wafer comprises a circlet wafer having an outer diameter greater than or equal to 450 millimeters.

9. The chemical vapor deposition system of claim 1, wherein the first gas injector includes a mixing chamber in fluid communication with a discharge port, a first flow line for providing a first reactive gas to the mixing chamber, and a second flow line for providing a second reactive gas to the mixing chamber, wherein the first and second reactive gases are mixed within the mixing chamber and subsequently discharged through the discharge port.

10. The chemical vapor deposition system of claim 9, wherein the first and second flow lines are generally parallel, and mixing chamber includes a transverse baffle that is transversely aligned with respect to the first and second flow lines.

11. The chemical vapor deposition system of claim 10, wherein the mixing chamber includes an inclined baffle that is obliquely aligned with respect to the first and second flow lines.

12. The chemical vapor deposition system of claim 1, wherein the first gas injector includes a discharge port through which first and second reactant gases can be discharged, and means for mixing the first and second reactant gas at a location upstream from the discharge port.

13. A chemical vapor deposition system comprising:
    a chemical vapor deposition chamber; and
    a gas injector positioned within the chemical vapor deposition chamber for discharging first and second reactive gases into the chamber, the gas injector including a mixing region for mixing the first and second reactive gases before the first and second reactive gases are discharged from the gas injector into the chamber.

14. The chemical vapor deposition system of claim 13, wherein the gas injector includes a first flow line for directing the first reactive gas to the mixing region and a second flow line for directing the second reactive gas to the mixing region, the first and second flow lines being substantially parallel.

15. The chemical vapor deposition system of claim 14, wherein the mixing region is at least partially defined by a mixing wall that extends obliquely across the first and second flow lines.

16. The chemical vapor deposition system of claim 15, wherein the mixing wall terminates at a discharge port.

17. The chemical vapor deposition system of claim 16, wherein the gas injector includes a baffle positioned upstream from the mixing wall.

18. The chemical vapor deposition system of claim 17, wherein the baffle is transversely aligned with respect to the first and second flow lines.

* * * * *

UNITED STATES PATENT AND TRADEMARK OFFICE
CERTIFICATE OF CORRECTION

PATENT NO. : 6,214,123 B1  
DATED : April 10, 2001  
INVENTOR(S) : Gardner et al.

Page 1 of 1

It is certified that error appears in the above-identified patent and that said Letters Patent is hereby corrected as shown below:

Column 3,  
Line 3, after "to", please delete "10".

Column 5,  
Line 8, "SiH4" should read -- $SiH_4$ --.

Signed and Sealed this

Twenty-first Day of May, 2002

Attest:

*Attesting Officer*

JAMES E. ROGAN  
*Director of the United States Patent and Trademark Office*